(12) United States Patent
Wang et al.

(10) Patent No.: US 10,879,078 B2
(45) Date of Patent: Dec. 29, 2020

(54) METHOD OF PATTERNING RESIST LAYER AND METHOD OF FORMING SEMICONDUCTOR STRUCTURE USING PATTERNED RESIST LAYER

(71) Applicant: Taiwan Semiconductor Manufacturing Co., Ltd., Hsinchu (TW)

(72) Inventors: Chien-Wei Wang, Zhubei (TW); Li-Po Yang, HsinChu (TW); Ching-Yu Chang, Yuansun Village (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 74 days.

(21) Appl. No.: 16/278,966

(22) Filed: Feb. 19, 2019

(65) Prior Publication Data

US 2020/0105521 A1    Apr. 2, 2020

Related U.S. Application Data

(60) Provisional application No. 62/737,256, filed on Sep. 27, 2018.

(51) Int. Cl.
*H01L 21/302* (2006.01)
*H01L 21/308* (2006.01)
(Continued)

(52) U.S. Cl.
CPC .......... *H01L 21/3088* (2013.01); *G03F 7/038* (2013.01); *G03F 7/039* (2013.01);
(Continued)

(58) Field of Classification Search
CPC ........... H01L 21/0276; H01L 21/31144; H01L 21/0332; H01L 21/0337; H01L 21/0338; H01L 21/0275; H01L 21/31058; H01L 21/823431; H01L 21/0273; H01L 29/66795; H01L 21/0274; H01L 21/3086; H01L 21/3088; G03F 7/16; G03F 7/162; G03F 7/168; G03F 7/2006; G03F 7/2004;
(Continued)

(56) References Cited

U.S. PATENT DOCUMENTS 8,178,287 B2 * 5/2012 Chang ...................... G03F 7/11
430/316
9,735,028 B2 * 8/2017 Chen ................. H01L 21/31116
(Continued)

*Primary Examiner* — Shouxiang Hu
(74) *Attorney, Agent, or Firm* — McClure, Qualey & Rodack, LLP

(57) ABSTRACT

A method of patterning a resist layer is provided. The method includes forming the resist layer over the top surface of a silicon-containing layer that has a first contact angle. The method also includes exposing and developing the resist layer to form a patterned resist layer and expose a portion of the top surface of the silicon-containing layer. The method also includes applying a treating compound to the exposed portion of the top surface of the silicon-containing layer, so that the exposed portion of the top surface has a second contact angle that is greater than the first contact angle. The method also includes reflowing the patterned resist layer over the top surface of the silicon-containing layer having the second contact angle.

20 Claims, 6 Drawing Sheets

(51) Int. Cl.
*H01L 21/027* (2006.01)
*H01L 21/311* (2006.01)
*H01L 21/033* (2006.01)
*G03F 7/16* (2006.01)
*G03F 7/20* (2006.01)
*G03F 7/38* (2006.01)
*G03F 7/30* (2006.01)
*G03F 7/039* (2006.01)
*G03F 7/038* (2006.01)
*H01L 21/3105* (2006.01)
*H01L 21/8234* (2006.01)

(52) U.S. Cl.
CPC ............... *G03F 7/16* (2013.01); *G03F 7/162* (2013.01); *G03F 7/168* (2013.01); *G03F 7/2004* (2013.01); *G03F 7/2006* (2013.01); *G03F 7/30* (2013.01); *G03F 7/38* (2013.01); *H01L 21/0273* (2013.01); *H01L 21/0274* (2013.01); *H01L 21/0275* (2013.01); *H01L 21/0276* (2013.01); *H01L 21/0332* (2013.01); *H01L 21/0337* (2013.01); *H01L 21/0338* (2013.01); *H01L 21/3086* (2013.01); *H01L 21/31058* (2013.01); *H01L 21/31144* (2013.01); *H01L 21/823431* (2013.01)

(58) Field of Classification Search
CPC ... G03F 7/38; G03F 7/30; G03F 7/039; G03F 7/038; G03F 7/0752; G03F 7/405; G03F 7/40
See application file for complete search history.

(56) References Cited

U.S. PATENT DOCUMENTS

2003/0186170 A1* 10/2003 Yamashita ............... G03F 7/40
                                                           430/311
2008/0076038 A1* 3/2008 Chang .................. G03F 7/0382
                                                           430/5
2018/0149976 A1* 5/2018 Liu .................. H01L 21/02282

* cited by examiner

METHOD OF PATTERNING RESIST LAYER AND METHOD OF FORMING SEMICONDUCTOR STRUCTURE USING PATTERNED RESIST LAYER

PRIORITY CLAIM AND CROSS-REFERENCE

This application claims the benefit of U.S. Provisional Application No. 62/737,256, filed on Sep. 27, 2018, and entitled "Method of patterning resist layer and method of forming semiconductor structure using patterned resist layer", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

One of the important drivers for increased performance in a semiconductor structure is the higher level of integration of circuits. This is accomplished by miniaturizing or shrinking device sizes on a given chip. As the device sizes are scaled down, lithography processes used to form those devices continue to become more difficult to perform. Therefore, it is a challenge to form reliable semiconductor devices at smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
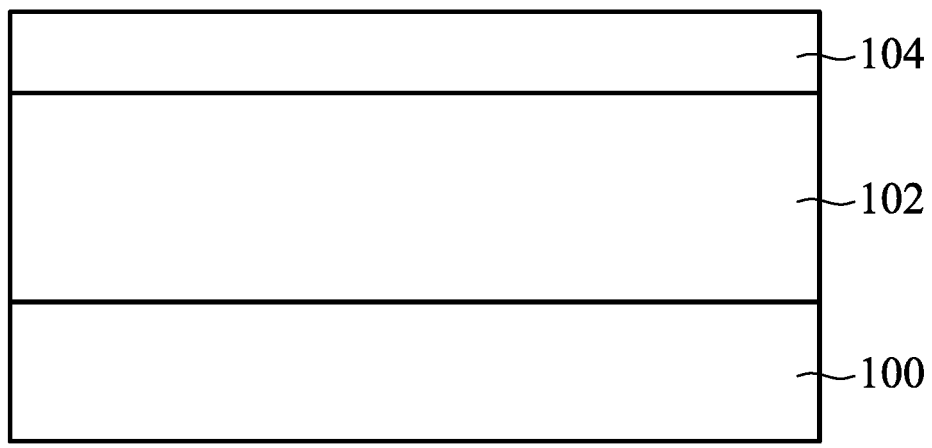
FIGS. 1A-1K show cross-sectional representations of various stages of forming a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The advanced lithography process, method, and materials described in the current disclosure can be used in many applications, including fin-type field effect transistors (Fin-FETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of methods of forming a semiconductor device structure are provided. The method includes forming a silicon-containing layer that has a first contact angle over a material layer and forming a patterned resist layer over the silicon-containing mask layer by successively performing an exposure process and a development process. The top surface of the silicon-containing layer uncovered by the patterned resist layer is reacted with a treating compound, so that the exposed top surface of the silicon-containing layer has a second contact angle that is greater than the first contact angle. Afterwards, the patterned resist layer can be reflowed to reduce the sidewall roughness of the patterned resist layer while preventing scum from forming on the lower portion of the patterned resist layer during the reflow process. Accordingly, the sidewall roughness of the patterned resist layer can be reduced, thereby improving the sidewall profile of the pattern in the underlying material layer and the obtaining a desired critical dimension (CD) of the pattern in the underlying material layer during a subsequent etching process.

FIGS. 1A-1K show cross-sectional representations of various stages of forming a semiconductor structure, in accordance with some embodiments. As shown in FIG. 1A, a substrate 100 is provided in accordance with some embodiments. The substrate 100 may be made of silicon or other semiconductor materials. In some embodiments, the substrate 100 is a semiconductor wafer such as a silicon wafer. Alternatively or additionally, the substrate 100 may include other elementary semiconductor materials such as crystal silicon, polycrystalline silicon, amorphous silicon, germanium, and diamond. In some embodiments, the substrate 100 is made of a compound semiconductor, such as silicon carbide, gallium arsenic, gallium phosphide, indium phosphide, indium arsenide, and indium antimonide. In some embodiments, the substrate 100 is made of an alloy semiconductor, such as SiGe, GaAsP, AlInAs, AlGaAs, GaInAs, GaInP, and GaInAsP. In some embodiments, the substrate 100 includes an epitaxial layer. For example, the substrate 100 has an epitaxial layer overlying a bulk semiconductor. In some other embodiments, the substrate 100 also includes a silicon-on-insulator (SOI) substrate. The SOI substrate may be fabricated using separation by implantation of oxygen (SIMOX), wafer bonding, and/or other suitable methods. Some device elements may be formed over the substrate 100. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 100 also includes various p-type doped regions and/or n-type doped regions, implemented by a process such as ion implantation and/or diffusion. For example, those doped regions may include n-well, p-well, light doped region (LDD), and doped source and drain (S/D) configured to form various integrated circuit (IC) devices, such as a complimentary metal-oxide-semiconductor field-effect transistor (CMOSFET), imaging sensor, and/or light emitting diode (LED). Doped regions may be doped with p-type dopants, such as boron or $BF_2$, and/or n-type dopants, such as phosphorus (P) or arsenic (As). In some other embodiments, the doped regions may be formed directly on the substrate 100.

The substrate 100 further includes other functional features such as a resistor or a capacitor formed in and on the substrate, in accordance with some embodiments. The substrate 100 may also include various isolation features. The isolation features separate various device regions in the substrate 100. The isolation features include different structures formed by using different processing technologies. For example, the isolation features may include shallow trench isolation (STI) features. The formation of a STI may include etching a trench in the substrate 100 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 100 also includes gate stacks formed by dielectric layers and electrode layers, in accordance with some embodiments. The dielectric layers may include an interfacial layer (IL) and a high-k dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi-layers, such as metal layer, liner layer, wetting layer, and adhesion layer, formed by ALD, PVD, CVD, and/or another suitable process.

The substrate 200 also includes a plurality of inter-level dielectric (ILD) layers and conductive features integrated to form an interconnect structure configured to electrically couple the various p-type and n-type doped regions and the other functional features (such as gate electrodes), resulting a functional integrated circuit, in accordance with some embodiments.

A material layer 102 is formed over the substrate 10, as shown in FIG. 1A in accordance with some embodiments. In some embodiments, the material layer 102 may be referred to as a target layer, which is configured to be patterned and has a target pattern region in subsequent manufacturing processes. The material layer 102 may be one or more material layers. In some embodiments, the material layer 102 includes a silicon layer, a dielectric layer, and/or a doped poly-silicon layer.

Afterwards, a bottom layer 104 is formed over the material layer 102. The bottom layer 104 may be a first layer of a tri-layer resist layer (also referred to as tri-layer photoresist). The bottom layer 104 may contain a material that is patternable and/or have an anti-reflection property. In some embodiments, the bottom layer 104 is a bottom anti-reflective coating (BARC) layer. In some embodiments, the bottom layer 104 is made of silicon free material. In some embodiments, the bottom layer 104 is formed by a spin-on coating process, chemical vapor deposition process (CVD), physical vapor deposition (PVD) process, and/or other suitable deposition processes.

Figure 1B:
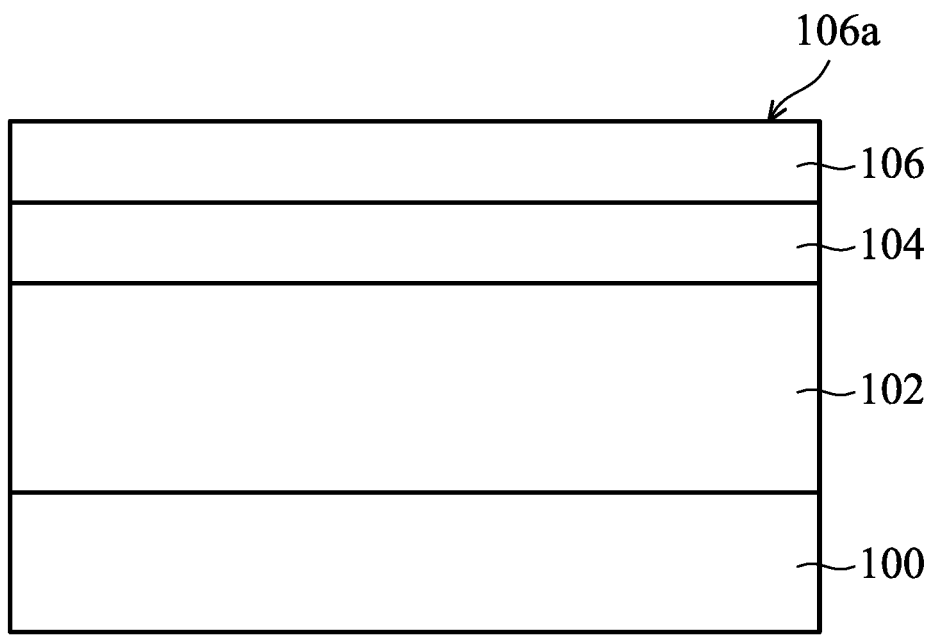

Afterwards, as shown in FIG. 1B, a middle layer 106 is formed over the bottom layer 104, in accordance with some embodiments. In some embodiments, the middle layer 106 may have a composition that provides an anti-reflective property and/or hard mask property for the photolithography process. In addition, the middle layer 106 is designed to provide etching selectivity from the bottom layer 104 and a subsequently formed top layer 108. In some embodiments, the middle layer 106 has a top surface 106a that has a first contact angle when measured using a reference liquid, such as water or another suitable liquid. In some embodiments, the first contact angle is in a range from about 40° to about 80° when measured using water.

In some embodiments, the middle layer 106 is formed of a silicon-containing layer and includes a hydrophilic group. In some embodiments, the hydrophilic group includes a hydroxyl group. In some other embodiments, the hydrophilic group includes ethylene glycol (n=1-10), propylene glycol (n=1-10), hydroxy benzene, benzoid acid, benzenesulfonic acid, benzene phosphonic acid, hydroxyl, carboxylic acid, sulfonic acid, phosphoric acid, cyclic lactone (such as γ-butyrolactone), cyclic carbonate (such as ethylene carbonate), cyclic sultone (such as propane sultone or butane sultone).

In some embodiments, the middle layer 106 may include a silicon-containing polymer. In some embodiments, the formation of the middle layer (or silicon-containing middle layer) 106 includes a deposition process and curing process. In some embodiments, the deposition process includes a spin-on coating process, chemical vapor deposition process (CVD), physical vapor deposition (PVD) process, and/or other suitable deposition processes. In some embodiments, the curing process includes a thermal baking process with a suitable baking temperature.

Figure 1C:
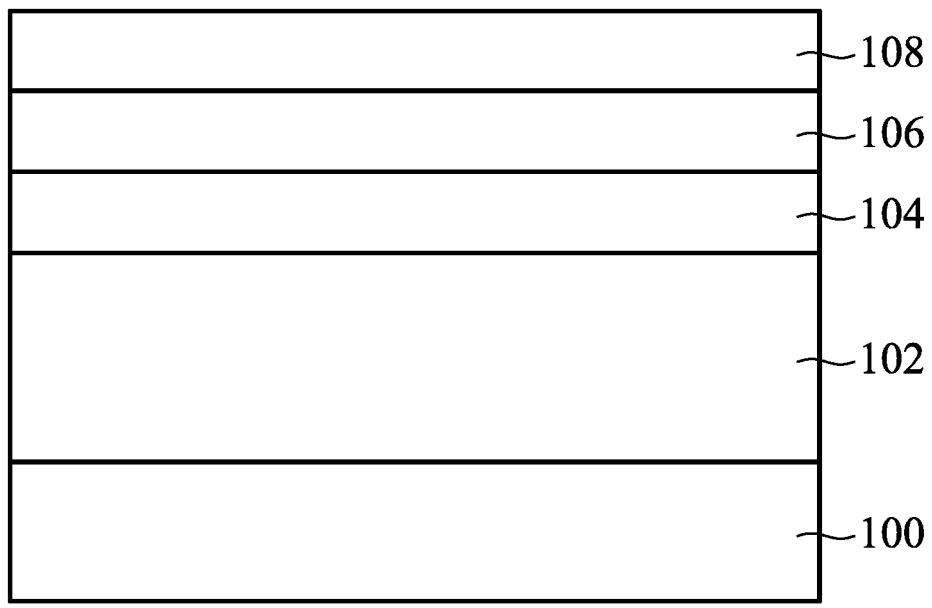

As shown in FIG. 1C, a top layer 108 is formed over the top surface 106a of the middle layer 106, in accordance with some embodiments. The top layer 108 may be positive resist or negative resist. In some embodiments, the top layer (or resist layer) 108 includes a carbon backbone polymer. In some embodiments, the top layer 108 is a chemical amplified (CA) resist. In some embodiments, the top layer 108 is formed of Poly (methyl methacrylate) (PMMA), Poly (methyl glutarimide) (PMGI), Phenol formaldehyde resin (DNQ/Novolac), SU-8 or another applicable material. The top layer 108 may include a photo-acid generator (PAG). When the top layer 108 is exposed to radiation (e.g., light), the PAG forms a small amount of acid.

In some embodiments, the top layer 108 is a positive resist layer used with a negative tone developer. In those cases, the top layer 108 is patterned by a negative tone development (NTD) process. The "Negative tone development (NTD) process" has been used to pattern material layers. The resist layer is exposed by a light source, followed by post-exposure baking. A portion of the composition of the exposed region of the resist layer is changed, and it is more difficult to dissolve this portion in the NTD solvent. When the resist layer is developed, only the unexposed region of the resist layer is washed away. In some other embodiments, the top layer 108 is a negative photoresist layer used with a positive tone developer. In those cases, the top layer 108 is patterned by a positive tone development (PTD) process. In the PTD process, a portion of the composition of the unexposed region of the resist layer is changed, and it is more difficult to dissolve this portion in the PTD solvent. When the resist layer is developed, only the exposed region of the resist layer is washed away.

Figure 1D:
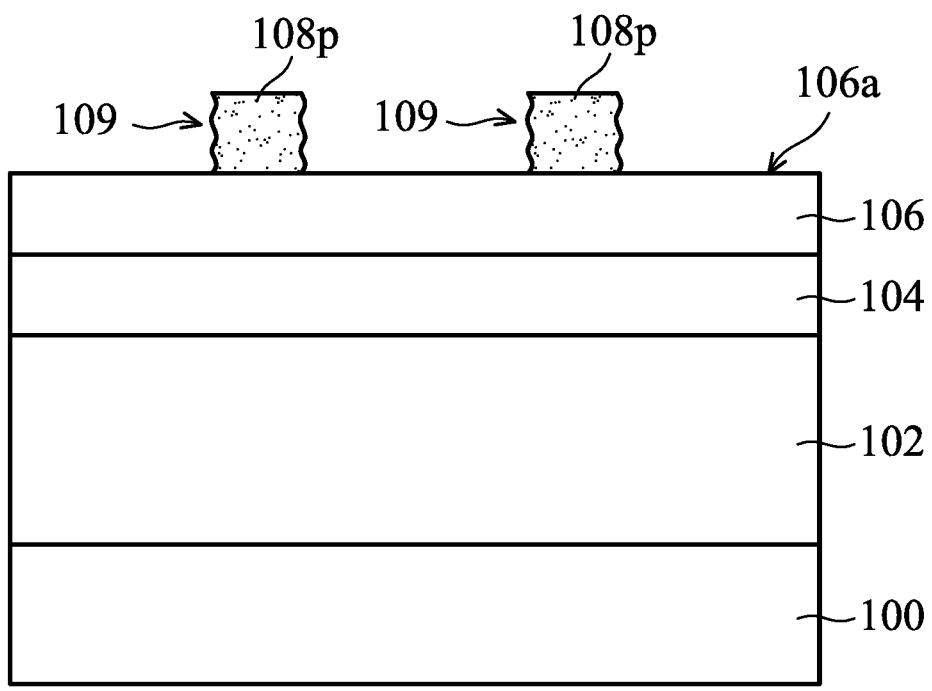

As shown in FIG. 1D, an exposure process and a development process are successively performed on the top layer 108, in accordance with some embodiments. In some embodiments, the exposure process is performed by using a radiation energy. For example, the radiation energy may include a 248 nm beam by Krypton Fluoride (KrF) excimer lasers, a 193 nm beam by Argon Fluoride (ArF) excimer lasers, a 157 nm beam by Fluoride (F2) Excimer Lasers, or Extreme ultra-violet (EUV) light, such as EUV light with wavelength at about 13.5 nm. After the exposure process, other processing steps, such as a post-exposure-baking (PEB) process is followed. In some embodiments, the top layer 108 is a chemically amplified resist (CAR) and the bake process is configured to improve the insolubility.

After the top layer 108 is exposed to radiation, the top layer 108 is developed by a developer to form a patterned top layer (i.e., patterned resist layer) 108p with rough sidewalls 109 and expose a portion of the top surface 106a of the middle layer 106. In some embodiments, the developer includes an organic solvent. The organic solvent may include a solvent such as, for example, a ketone-based solvent, ester-based solvent, alcohol-based solvent, amide-based solvent, ether-based solvent, hydrocarbon-based solvent, and/or other suitable solvent.

Due to the rough sidewalls 109, the profile of the underlying material layer 102 may be poor and an undesired critical dimension (CD) of the underlying material layer 102 may be obtained during a subsequent patterning process that is performed on the material layer 102.

In some embodiments, the sidewall profile of the material layer 102 is improving by performing a reflow process on the patterned top layer 108p, so that the patterned top layer 108p has sidewalls with less roughness than that of the patterned top layer 108p before the reflow process is performed. However, residual resist (which is sometimes referred to as scum) may form around the lower sidewall of the patterned top layer 108p. The scum also impacts the critical dimension (CD) of the patterned material layer 102 after a subsequent etching process. Accordingly, a descum process may be performed on the patterned top layer 108p before the subsequent patterning process is performed on the material layer 102.

Figure 1E:
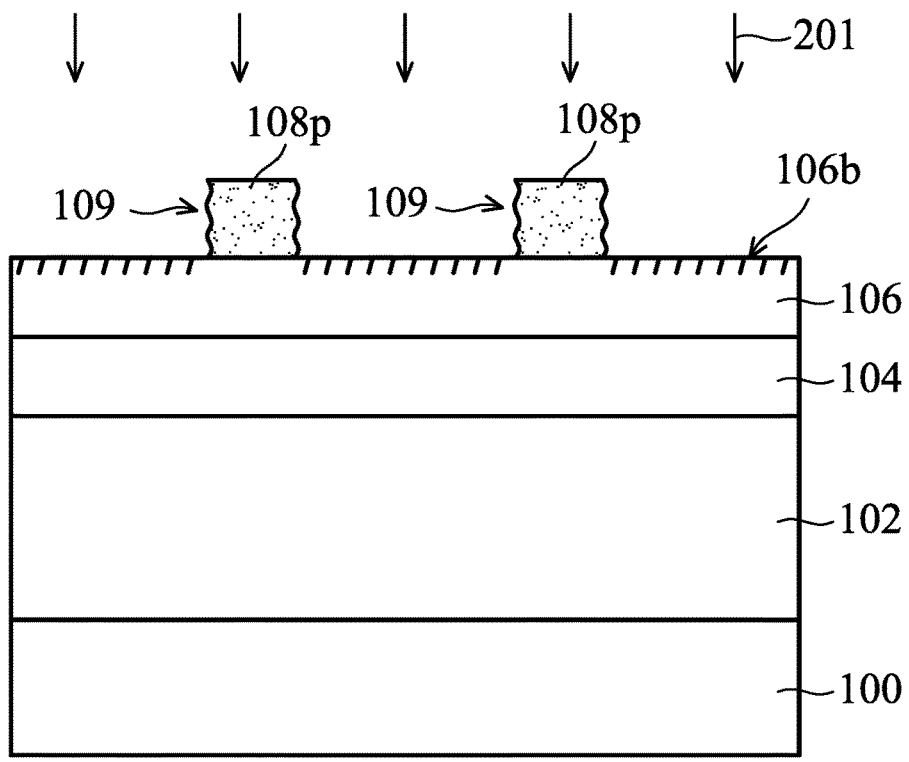

In some embodiments, a surface treatment 201 is performed on the middle layer 106 that is uncovered by the patterned top layer 108p, so as to prevent residual resist (e.g., scum) from forming during a subsequent reflow process, as shown in FIG. 1E. During the surface treatment 201, a treating compound (not shown) is applied to the exposed portion of the top surface 106a (indicated in FIG. 1D) of the middle layer 106, so that the treating compound reacts with the top surface 106a of the middle layer 106. After the surface treatment 201 is performed, the exposed portion of the top surface 106b is modified to have a second contact angle that is greater than the first contact angle. In some embodiments, the second contact angle is in a range from about 43° to about 110° when measured using water. In some embodiments, the difference between the second contact angle and the first contact angle is in a range from about 3° to about 30°.

The sufficient difference between the second contact angle and the first contact angle is designed to effectively prevent the residual resist (i.e., scum) from forming around the lower sidewall of the patterned top layer 108p during the reflow process. Since the sidewall roughness of the patterned top layer 108p can be effectively reduced and no scum forms after the reflow process is performed, the line edge roughness (LER) or line width roughness (LWR) of the patterned top layer 108p is improved. As a result, the sidewall profile of the pattern in the material layer 102 can be improved after a subsequent etching process is performed. Since no scum forms during the reflow process, there is no need to perform an additional descum process on the patterned top layer 108p before the subsequent etching process is performed on the material layer 102.

In some embodiments, the treating compound used in the surface treatment 201 includes $C_1$-$C_{100}$ organic group, a first functional group and a second functional group, in which the first functional group and the second functional group are bonded to the $C_1$-$C_{100}$ organic group. In some embodiments, the treating compound has a formula: L-X-R, where X is the $C_1$-$C_{100}$ organic group, L is the first functional group and R is the second functional group. In some embodiments, the treating compound reacts with the hydrophilic group in the middle layer 106, so that the first functional group (L) is bonded to the hydrophilic group. Namely, the first functional group (L) serves as a linker that is bonded to the middle layer 106. After the treating compound is reacted with the hydrophilic group in the middle layer 106, the second functional group (R) changes the first contact angle of the exposed portion of the top surface 106a of the middle layer 106. As a result, the exposed portion the middle layer 106 uncovered by the patterned top layer 108p has a top surface 106b with the second contact angle greater than the first contact angle.

In some embodiments, the $C_1$-$C_{100}$ organic group (X) is a $C_1$-$C_{100}$ aliphatic or $C_4$-$C_{100}$ aromatic hydrocarbon group. In some embodiments, the $C_1$-$C_{100}$ organic group (X) includes alkylene, alkenylene, or alkenylene. In some embodiments, the $C_1$-$C_{100}$ organic group (X) includes $CH_2CH_2CH_3$. In some embodiments, the first functional group (L) includes a carboxylic acid group, an alcohol group, an alkoxyl group, an ester group, an amine group, an amide group, a sulfur group, or a phosphine group. In some embodiments, the second functional group (R) includes a carboxylic acid group, an alcohol group, an alkoxyl group, an ester group, an amine group, an amide group, a halide group, a sulfur group, or a phosphine group.

Figure 1F:
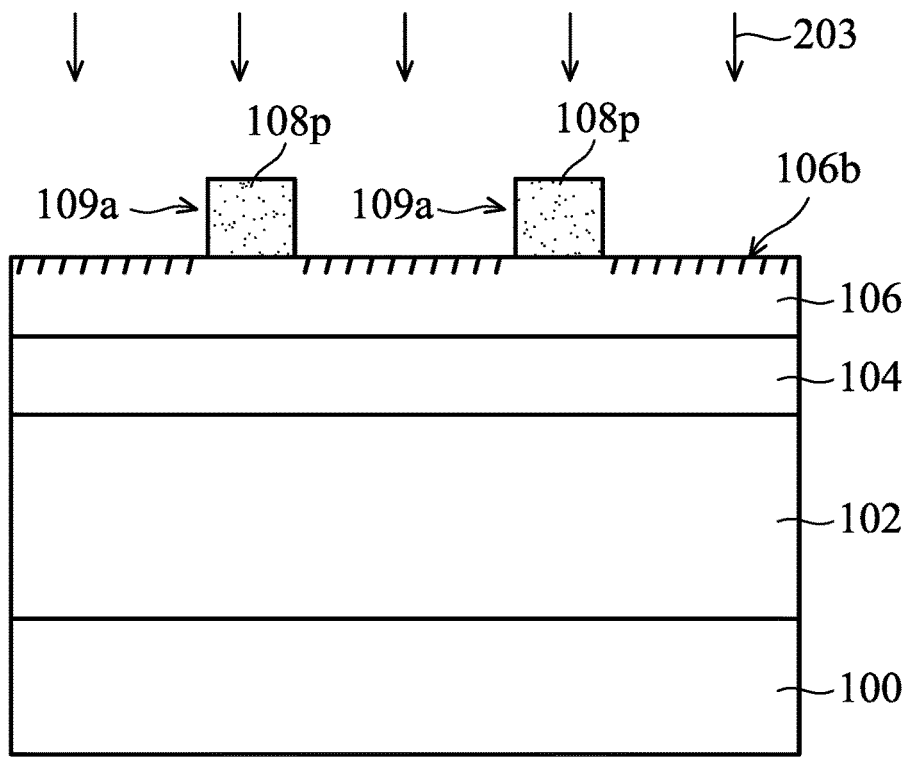

As shown in FIG. 1F, a reflow process 203 is performed on the patterned top layer 108p over the top surface 106b of the middle layer 106 having the second contact angle, in accordance with some embodiments. After the reflow process 203 is performed, the patterned top layer 108p with rough sidewalls 109 (as shown in FIG. 1E) can be modified, so that the patterned top layer 108p has modified sidewalls 109a that have less roughness than that of the patterned top layer 108p before the reflow process 203 is performed. Moreover, since the top surface 106b of the exposed portion the middle layer 106 uncovered by the patterned top layer 108p having a sufficient contact angle (e.g., in a range from about 43° to about 110°), no scum is formed around the lower portion of the sidewall 109a of the patterned top layer 108p during the reflow process 203.

In some embodiments, the reflow process 203 includes an electromagnetic wave radiation process. For example, the electromagnetic wave radiation includes a wave length in a range from about 100 nm to about 1500 nm. In some embodiments, the reflow process 203 includes a plasma process using a process gas including, for example, N2, Ar, and H2. During the plasma process, a bias voltage may be provided. For example, the provided bias voltage is in a range from −100 volt about 100 volt. In some embodiments, the reflow process 203 includes a chemical treatment using a solution containing a plasticizer. In some embodiments, the plasticizer includes at least surfactant and is employed to reduce the Tg (glass transition temperature) of the patterned top layer 108p. In some embodiments, the surfactant is an ionic or nonionic surfactant. For example, the ionic surfactant may include at least tetraamonium salt or fluorine containing surfactant. The nonionic surfactant may include at least polyether (e.g., polyethylene oxide).

Figure 1G:
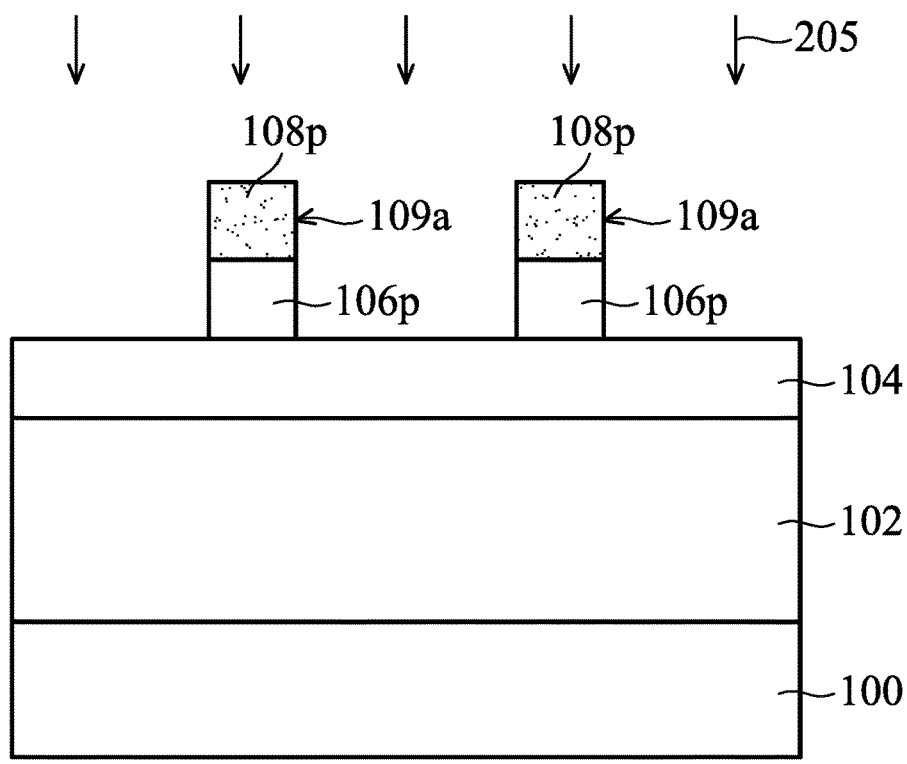

As shown in FIG. 1G, the pattern of the patterned top layer 108p with modified sidewall 109a is transferred to the middle layer 106a, in accordance with some embodiments. In some embodiments, a portion of the middle layer 106 is removed by an etching process 205 using the patterned top layer 108p as a mask, so as to form a patterned middle layer 106p. In some embodiments, the etching process 205 includes a dry etching process, a wet etching process or a combination thereof. In some embodiments, the etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof.

Figure 1H:
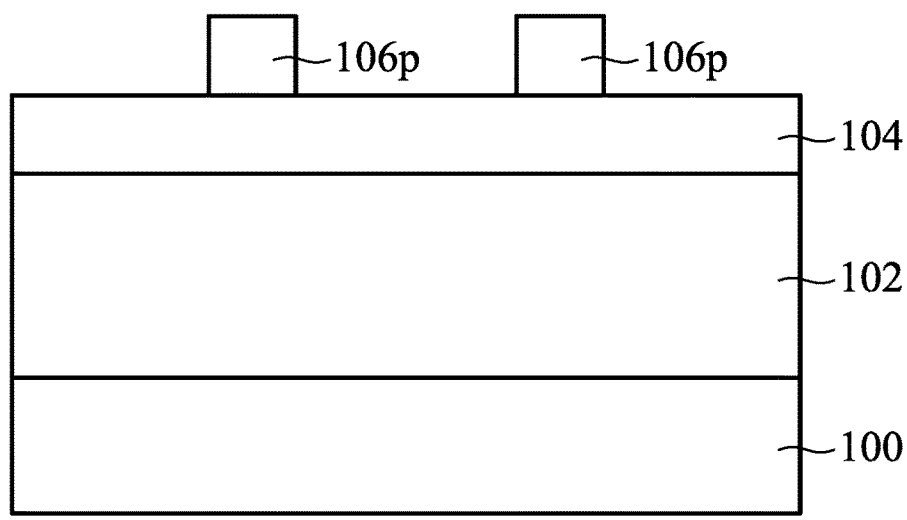

Afterwards, as shown in FIG. 1H, the patterned top layer 108p is removed, in accordance with some embodiments. In some embodiments, the patterned top layer 108p is removed by a dry etching process, a wet etching process or another suitable resist stripping process.

Figure 1I:
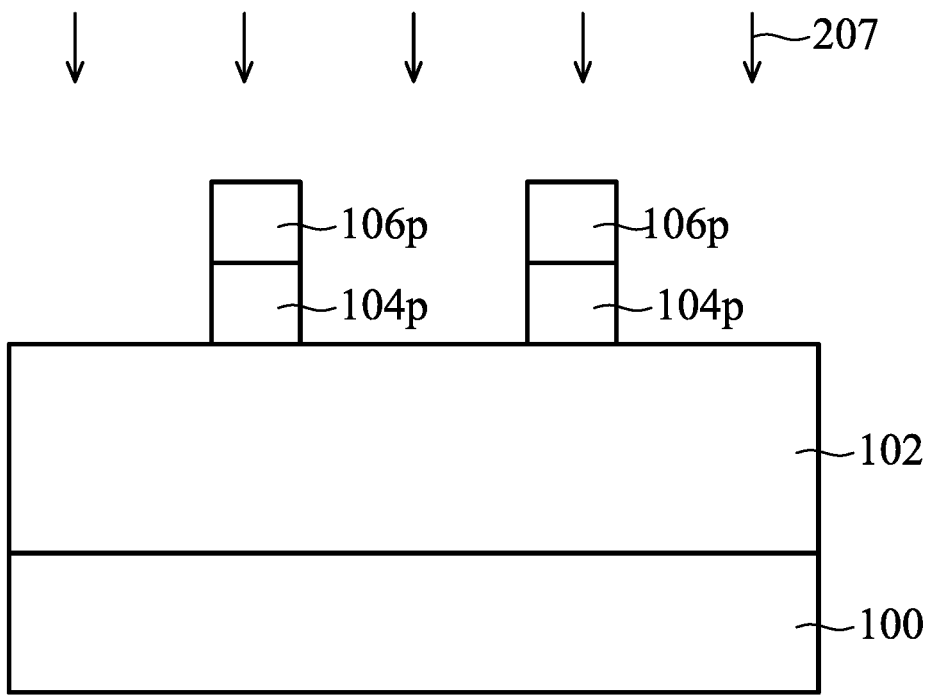

As shown in FIG. 1I, the pattern of the patterned middle layer 106p is transferred to the bottom layer 104, in accordance with some embodiments. In some embodiments, a portion of the bottom layer 104 is removed by an etching process 207 using the patterned middle layer 106p as a mask, so as to form a patterned bottom layer 104p. As a result, the patterned middle layer 106p and the underlying patterned bottom layer 104p form a patterned mask structure to expose a portion of the material layer 102.

In some embodiments, since the patterned middle layer 106p is a silicon-containing material while the bottom layer 104 is a silicon-free material, the etching selectivity is achieved through proper choice of the etchant. In some embodiments, the etching process 207 is a plasma etching process using an etchant having a sulfur-containing gas and an oxygen-containing gas. In some embodiments, the oxygen-containing gas includes oxygen ($O_2$). In some embodiments, the sulfur-containing gas includes carbonyl sulfide (COS) or sulfur dioxide ($SO_2$).

Figure 1J:
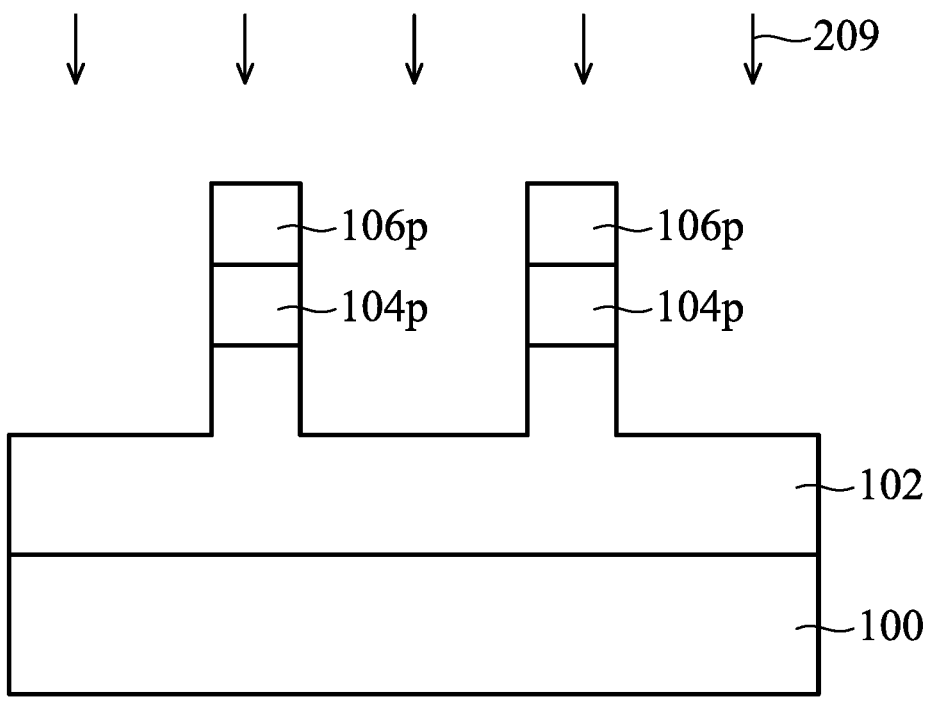

Afterwards, as shown in FIG. 1J, the pattern of the patterned mask structure (i.e., the patterned middle layer 106p and the underlying patterned bottom layer 104p) is transferred to the bottom layer 104, in accordance with some embodiments. In some embodiments, an etching process 209 is performed to etch the material layer 102 using the patterned middle layer 106p and the underlying patterned bottom layer 104p as masks. In some embodiments, the etching process 209 is a dry etching process, a wet etching process or another suitable resist stripping process. After the etching process 209 is performed, the material layer 104 is patterned to form patterns therein.

Figure 1K:
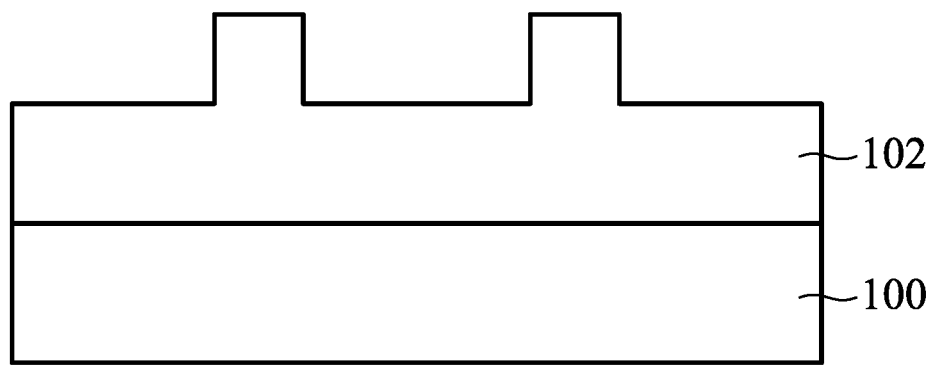

Afterwards, as shown in FIG. 1K, the patterned middle layer 106p and the underlying patterned bottom layer 104p are removed by a wet etching process, in accordance with some embodiments. In some embodiments, the wet etching process includes a first etching solution including sulfuric acid ($H_2SO_4$), hydrogen peroxide ($H_2O_2$) and water, and a second etching solution including ammonium hydroxide ($NH_4OH$), hydrogen peroxide ($H_2O_2$) and water. The patterned middle layer 106p and the patterned bottom layer 104p are removed by the first etching solution and the second etching solution.

Embodiments for forming a semiconductor device structure are provided. A multi-layer mask structure is formed over a material layer. The multi-layer mask structure includes a bottom layer, a silicon-containing middle layer and a top layer formed of resist. The multi-layer mask structure is used to pattern the underlying material layer and then is removed. After the top layer is exposed and developed to form a patterned top layer, the top surface of the silicon-containing middle layer exposed from the patterned top layer is reacted with a treating compound, so that the contact angle of the exposed top surface is increased. Afterwards, a reflow process is performed on the patterned top layer, so as to reduce the sidewall roughness of the patterned top layer. Since the top surface of the exposed silicon-containing middle layer has the increased contact angle, the residual resist (i.e., scum) can be prevented from being formed around the lower sidewall of the patterned top layer. during the reflow process. As a result, the line edge roughness (LER) or line width roughness (LWR) of the patterned top layer is improved. The silicon-containing middle layer and the bottom layer are successively patterned using the patterned top layer as a mask. Accordingly, the sidewall profile of the material layer can be improved after a subsequent etching process is performed using the patterned silicon-containing middle layer and the patterned bottom layer as masks.

In some embodiments, a method of patterning a resist layer is provided. The method includes forming the resist layer over the top surface of a silicon-containing layer that has a first contact angle. The method also includes exposing and developing the resist layer to form a patterned resist layer and to expose a portion of the top surface of the silicon-containing layer. The method also includes applying a treating compound to the exposed portion of the top surface of the silicon-containing layer, so that the exposed portion of the top surface has a second contact angle that is greater than the first contact angle. The method also includes reflowing the patterned resist layer over the top surface of the silicon-containing layer having the second contact angle.

In some embodiments, a method of forming a patterned mask structure is provided. The method also includes forming a silicon-containing middle layer that has a first contact angle over a bottom layer. The method also includes forming a top layer including resist over the silicon-containing middle layer. The method also includes exposing and developing the top layer to form a patterned top layer and expose a portion of the top surface of the silicon-containing middle layer. The method also includes applying a treating compound to the exposed portion of the top surface of the silicon-containing middle layer, so that the exposed portion of the top surface has a second contact angle that is greater than the first contact angle. The method also includes reflowing the patterned top layer over the top surface of the silicon-containing middle layer having the second contact angle. The method also includes patterning the silicon-containing middle layer by using the patterned top layer as a mask to form a patterned silicon-containing middle layer. The method also includes patterning the bottom layer by using the patterned silicon-containing middle layer as a mask to form a patterned bottom layer. The silicon-containing middle layer and the patterned bottom layer form the patterned mask structure.

In some embodiments, a method of forming a semiconductor device structure is provided. The method includes forming a silicon-containing mask layer having a top surface with a first contact angle over a material layer. The method also includes forming a patterned resist layer over the silicon-containing mask layer by successively performing an exposure process and a development process on a resist layer, so as to expose a portion of the silicon-containing mask layer. The method also includes reacting the exposed portion of the silicon-containing mask layer with a treating compound, so that a top surface of the exposed portion of silicon-containing mask layer has a second contact angle that is greater than the first contact angle. The method also includes reflowing the patterned resist layer over the top surface of the silicon-containing mask layer having the second contact angle. The method also includes successively etching the exposed portion of the silicon-containing mask layer and the material layer under the exposed portion of the silicon-containing mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a patterned mask structure, comprising:
    forming a silicon-containing middle layer that has a first contact angle over a bottom layer;
    forming a top layer comprising resist over the silicon-containing middle layer;
    exposing and developing the top layer to form a patterned top layer and expose a portion of the top surface of the silicon-containing middle layer;
    applying a treating compound to the exposed portion of the top surface of the silicon-containing middle layer, so that the exposed portion of the top surface has a second contact angle that is greater than the first contact angle;
    reflowing the patterned top layer over the top surface of the silicon-containing middle layer having the second contact angle;
    patterning the silicon-containing middle layer by using the patterned top layer as a mask to form a patterned silicon-containing middle layer; and
    patterning the bottom layer by using the patterned silicon-containing middle layer as a mask to form a patterned bottom layer, wherein the silicon-containing middle layer and the patterned bottom layer form the patterned mask structure.

2. The method as claimed in claim 1, wherein the silicon-containing middle layer comprises a hydrophilic group that is reacted with the treating compound.

3. The method as claimed in claim 1, wherein the treating compound comprises a $C_1$-$C_{100}$ organic group and first and second functional groups bonded to the $C_1$-$C_{100}$ organic group, and wherein the first functional group is bonded to the hydrophilic group and the second functional group changes the first contact angle to the second contact angle.

4. The method as claimed in claim 1, wherein a difference between the second contact angle and the first contact angle is in a range from about 3° to about 30°.

5. A method of forming a semiconductor device structure, comprising:
    forming a silicon-containing mask layer having a top surface with a first contact angle over a material layer;
    forming a patterned resist layer over the silicon-containing mask layer by successively performing an exposure process and a development process on a resist layer, so as to expose a portion of the silicon-containing mask layer;
    reacting the exposed portion of the silicon-containing mask layer with a treating compound, so that a top surface of the exposed portion of silicon-containing mask layer has a second contact angle that is greater than the first contact angle;
    reflowing the patterned resist layer over the top surface of the silicon-containing mask layer having the second contact angle; and
    successively etching the exposed portion of the silicon-containing mask layer and the material layer under the exposed portion of the silicon-containing mask layer.

6. The method as claimed in claim 5, wherein the silicon-containing mask layer comprises a hydroxyl group, wherein the treating compound comprises a $C_1$-$C_{100}$ organic group and first and second functional groups bonded to the $C_1$-$C_{100}$ organic group, and wherein the first functional group is bonded to the hydroxyl group and the second functional group changes the first contact angle to the second contact angle.

7. The method as claimed in claim 5, wherein the difference between the second contact angle and the first contact angle is in a range from about 3° to about 30°.

8. The method as claimed in claim 5, wherein the development process is a positive tone development process and the patterned resist layer is reflowed by performing a chemical treatment using a solution containing a plasticizer.

9. The method as claimed in claim 5, wherein the development process is a negative tone development process and the patterned resist layer is reflowed by performing a chemical treatment using a solution containing a plasticizer.

10. A method of forming a semiconductor device structure, comprising:
    forming a silicon-containing layer having a top surface with a first contact angle over a material layer;
    forming a patterned resist layer over the top surface of the silicon-containing layer, wherein the patterned resist layer exposes a portion of the top surface of the silicon-containing layer;
    applying a treating compound to the exposed portion of the top surface of the silicon-containing layer, so that the exposed portion of the top surface has a second contact angle that is greater than the first contact angle;
    reflowing the patterned resist layer over the top surface of the silicon-containing layer having the second contact angle;
    patterning the silicon-containing layer using the reflowed patterned resist layer as a mask; and
    patterning the material layer using the patterned silicon-containing layer as a mask.

11. The method as claimed in claim 10, wherein the silicon-containing layer comprises a hydrophilic group that reacts with the treating compound.

12. The method as claimed in claim 11, wherein the silicon-containing layer is formed of an inorganic polymer and the hydrophilic group is a hydroxyl group.

13. The method as claimed in claim 10, wherein the treating compound comprises a $C_1$-$C_{100}$ organic group.

14. The method as claimed in claim 13, wherein the treating compound further comprises a first functional group and a second functional group bonded to the $C_1$-$C_{100}$ organic group, and wherein the first functional group is bonded to the hydrophilic group and the second functional group changes the first contact angle to the second contact angle.

15. The method as claimed in claim 14, wherein the first functional group comprises a carboxylic acid group, an alcohol group, an alkoxyl group, an ester group, an amine group, an amide group, a sulfur group, or a phosphine group.

16. The method as claimed in claim 14, wherein the second functional group comprises a carboxylic acid group, an alcohol group, an alkoxyl group, an ester group, an amine group, an amide group, a halide group, a sulfur group, or a phosphine group.

17. The method as claimed in claim 13, wherein the $C_1$-$C_{100}$ organic group is a $C_1$-$C_{100}$ aliphatic or $C_4$-$C_{100}$ aromatic hydrocarbon group.

18. The method as claimed in claim 10, wherein the patterned resist layer is reflowed by performing a chemical treatment using a solution containing a plasticizer.

19. The method as claimed in claim 10, wherein a difference between the second contact angle and the first contact angle is in a range from about 3° to about 30°.

20. The method as claimed in claim 1, wherein the patterned resist layer is reflowed by performing an electromagnetic wave radiation process or a plasma process.

* * * * *